(12) United States Patent
Zi et al.

(10) Patent No.: US 10,866,516 B2
(45) Date of Patent: *Dec. 15, 2020

(54) METAL-COMPOUND-REMOVING SOLVENT AND METHOD IN LITHOGRAPHY

(71) Applicant: Taiwan Semiconductor Manufacturing Co., Ltd., Hsin-Chu (TW)

(72) Inventors: An-Ren Zi, Hsinchu (TW); Joy Cheng, Taoyuan (TW); Ching-Yu Chang, Yilang County (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 324 days.

This patent is subject to a terminal disclaimer.

(21) Appl. No.: 15/351,529

(22) Filed: Nov. 15, 2016

(65) Prior Publication Data

US 2018/0039182 A1 Feb. 8, 2018

Related U.S. Application Data

(60) Provisional application No. 62/371,324, filed on Aug. 5, 2016.

(51) Int. Cl.
| | |
|---|---|
| G03F 7/26 | (2006.01) |
| H01L 21/027 | (2006.01) |
| H01L 21/02 | (2006.01) |
| G03F 7/16 | (2006.01) |
| G03F 7/38 | (2006.01) |
| G03F 7/30 | (2006.01) |
| G03F 7/004 | (2006.01) |
| G03F 7/40 | (2006.01) |

(52) U.S. Cl.
CPC .............. *G03F 7/26* (2013.01); *G03F 7/0043* (2013.01); *G03F 7/162* (2013.01); *G03F 7/168* (2013.01); *G03F 7/3057* (2013.01); *G03F 7/38* (2013.01); *H01L 21/0206* (2013.01); *H01L 21/0209* (2013.01); *H01L 21/0274* (2013.01); *G03F 7/40* (2013.01)

(58) Field of Classification Search
CPC .......... G03F 7/0043; G03F 7/26; G03F 7/168; G03F 7/162; G03F 7/3057; G03F 7/30; G03F 7/38; H01L 21/0206

See application file for complete search history.

(56) References Cited

U.S. PATENT DOCUMENTS

| | | | |
|---|---|---|---|
| 6,184,148 B1 * | 2/2001 | Nakamura | ............. G03F 7/427 438/715 |
| 8,216,767 B2 | 7/2012 | Wang et al. | |
| 8,323,870 B2 | 12/2012 | Lee et al. | |
| 8,580,117 B2 | 11/2013 | Kao et al. | |
| 8,628,897 B1 | 1/2014 | Lu et al. | |
| 8,658,344 B2 | 2/2014 | Wang et al. | |
| 8,679,707 B2 | 3/2014 | Lee et al. | |
| 8,691,476 B2 | 4/2014 | Yu et al. | |
| 8,709,682 B2 | 4/2014 | Chen et al. | |
| 8,715,890 B2 | 5/2014 | Tu et al. | |
| 8,715,919 B2 | 5/2014 | Chang et al. | |
| 8,722,286 B2 | 5/2014 | Yu et al. | |
| 8,741,551 B2 | 6/2014 | Wu et al. | |
| 8,753,788 B1 | 6/2014 | Yu et al. | |
| 8,764,995 B2 | 7/2014 | Chang et al. | |
| 8,765,330 B2 | 7/2014 | Shin et al. | |
| 8,765,582 B2 | 7/2014 | Hsu et al. | |
| 8,785,084 B2 | 7/2014 | Lu et al. | |
| 8,828,625 B2 | 9/2014 | Lu et al. | |
| 8,841,047 B2 | 9/2014 | Yu et al. | |
| 8,877,409 B2 | 11/2014 | Hsu et al. | |
| 10,622,211 B2 * | 4/2020 | Zi | ............................. B08B 3/08 |
| 2001/0012869 A1 * | 8/2001 | Fukushima | .......... C09D 183/16 524/588 |
| 2006/0103818 A1 | 5/2006 | Holmes et al. | |
| 2007/0091287 A1 | 4/2007 | Chang et al. | |
| 2013/0202992 A1 | 8/2013 | Chen et al. | |
| 2013/0296214 A1 * | 11/2013 | Barnes | .............. H01L 21/02063 510/176 |
| 2013/0323641 A1 | 12/2013 | Chang | |
| 2014/0011133 A1 | 1/2014 | Liu et al. | |
| 2014/0017615 A1 | 1/2014 | Chang | |
| 2014/0017616 A1 | 1/2014 | Chang | |
| 2014/0038423 A1 * | 2/2014 | Iwao | .................. H01L 21/02104 438/758 |
| 2014/0065843 A1 | 3/2014 | Chang et al. | |
| 2014/0117563 A1 | 5/2014 | Yu et al. | |
| 2014/0120459 A1 | 5/2014 | Liu et al. | |
| 2014/0186773 A1 | 7/2014 | Chang | |
| 2014/0255850 A1 | 9/2014 | Chang et al. | |
| 2014/0272709 A1 | 9/2014 | Liu et al. | |
| 2014/0272726 A1 | 9/2014 | Chang | |
| 2014/0273521 A1 | 9/2014 | Wu et al. | |
| 2015/0192851 A1 * | 7/2015 | Yamashita | ............. G03F 7/2002 430/296 |
| 2015/0286146 A1 | 10/2015 | Chang et al. | |
| 2015/0309405 A1 | 10/2015 | Shih et al. | |
| 2015/0311075 A1 | 10/2015 | Huang et al. | |

* cited by examiner

*Primary Examiner* — Daborah Chacko-Davis

(74) *Attorney, Agent, or Firm* — Haynes and Boone, LLP

(57) ABSTRACT

A photoresist layer is coated over a wafer. The photoresist layer includes a metal-containing material. An extreme ultraviolet (EUV) lithography process is performed to the photoresist layer to form a patterned photoresist. The wafer is cleaned with a cleaning fluid to remove the metal-containing material. The cleaning fluid includes a solvent having Hansen solubility parameters of delta D in a range between 13 and 25, delta P in a range between 3 and 25, and delta H in a range between 4 and 30. The solvent contains an acid with an acid dissociation constant less than 4 or a base with an acid dissociation constant greater than 9.

20 Claims, 11 Drawing Sheets

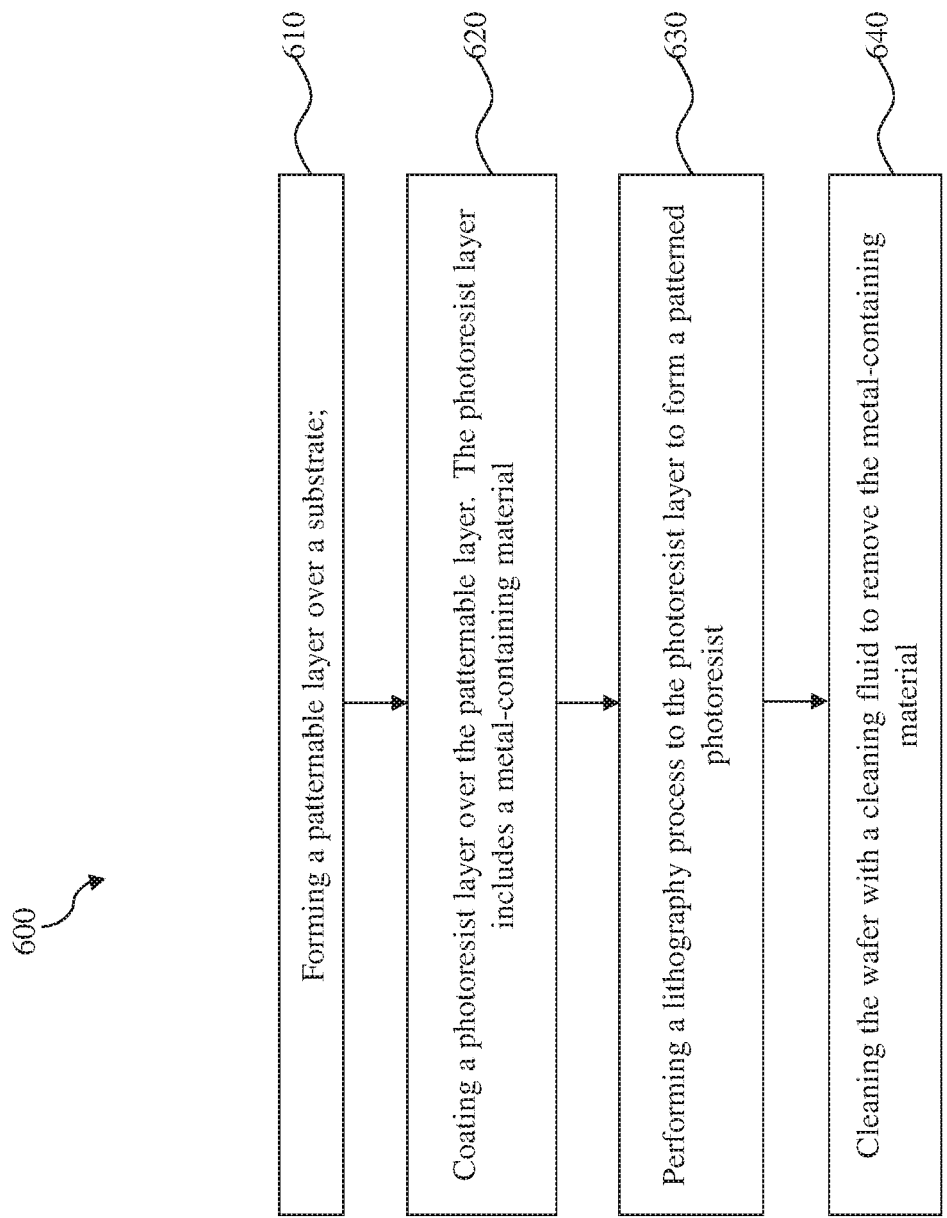

METAL-COMPOUND-REMOVING SOLVENT AND METHOD IN LITHOGRAPHY

PRIORITY DATA

This application claims priority to U.S. Provisional Patent Application Ser. No. 62/371,324, filed on Aug. 5, 2016, the entire disclosure of which is hereby, incorporated herein by reference.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased.

As the semiconductor device sizes continue to shrink, for example below 20 nanometer (nm) nodes, traditional lithography technologies have optical restrictions, which leads to resolution issues and may not achieve the desired lithography performance. In comparison, extreme ultraviolet (EUV) lithography can achieve much smaller device sizes. However, conventional EUV lithography still has some shortcomings, for example shortcomings with respect to EUV photo absorption and/or contamination caused by metal-containing materials. As a result, semiconductor fabrication performance may be compromised or degraded.

Therefore, while existing systems and method for performing EUV lithography have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 11 is a flowchart illustrating a method of fabricating a semiconductor device in accordance with some embodiments of the present disclosure.

DETAILED DESCRIPTION

Figure 1:
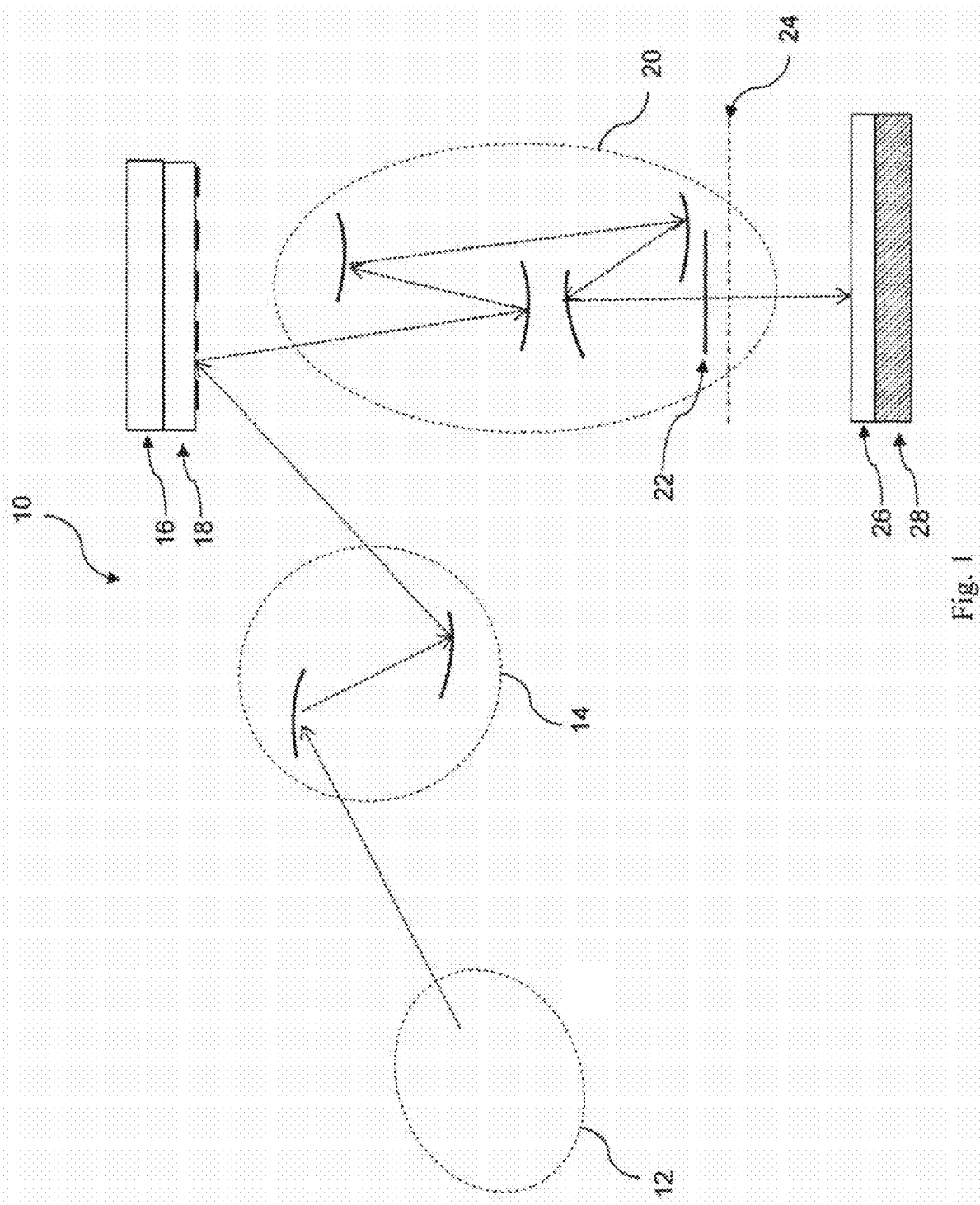
FIG. 1 is a schematic view of a lithography system constructed in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Extreme ultraviolet (EUV) lithography has become widely used due to its ability to achieve small semiconductor device sizes. However, conventional systems and methods of performing EUV lithography may have shortcomings. For example, conventional photoresist materials are typically organic materials. These organic materials may not be optimized for photon absorption in the EUV range. Thus, metal-containing materials may be added to photoresist materials for EUV lithography. However, these metal-containing materials may cause potential contamination problems. For example, if the metal-containing materials are not properly washed away or otherwise removed from the EUV photolithography apparatus or the wafer undergoing EUV lithography, they could cause contamination for subsequent semiconductor fabrication processes where metal is not needed (or desired), or they could contaminate other semiconductor fabrication tools as the wafer is transferred between the various semiconductor fabrication tools. The contamination due to the metal-containing materials in the EUV photoresist may therefore cause semiconductor fabrication problems and/or degrade semiconductor device performance.

To overcome the problems discussed above, the present disclosure provides a novel solvent and a novel system and method of using the solvent to effectively clean the metal-containing materials (in EUV photoresist) off of the wafer. The various aspects of the present disclosure will be discussed below in greater detail with reference to FIGS. 1-10.

First, a EUV lithography system will be discussed below with reference to FIGS. 1-2. Next, the details of a cleaning system and method according to embodiments of the present disclosure are discussed with reference to FIGS. 3-10.

FIG. 1 is a schematic view diagram of a EUV lithography system 10, constructed in accordance with some embodiments. The EUV lithography system 10 may also be generically referred to as a scanner that is configured to perform lithography exposure processes with respective radiation source and exposure mode. The EUV lithography system 10 is designed to expose a photoresist layer by EUV light or EUV radiation. The photoresist layer is a material sensitive to the EUV light. The EUV lithography system 10 employs a radiation source 12 to generate EUV light, such as EUV light having a wavelength ranging between about 1 nm and about 100 nm. In one particular example, the radiation source 12 generates a EUV light with a wavelength centered at about 13.5 nm. Accordingly, the radiation source 12 is also referred to as EUV radiation source 12.

The lithography system 10 also employs an illuminator 14. In various embodiments, the illuminator 14 includes various refractive optic components, such as a single lens or a lens system having multiple lenses (zone plates) or alternatively reflective optics (for EUV lithography system), such as a single mirror or a mirror system having multiple mirrors in order to direct light from the radiation source 12 onto a mask stage 16, particularly to a mask 18 secured on the mask stage 16. In the present embodiment where the radiation source 12 generates light in the EUV wavelength range, the illuminator 14 employs reflective optics. In some embodiments, the illuminator 14 includes a dipole illumination component.

In some embodiments, the illuminator 14 is operable to configure the mirrors to provide a proper illumination to the mask 18. In one example, the mirrors of the illuminator 14 are switchable to reflect EUV light to different illumination positions. In some embodiment, a stage prior to the illuminator 14 may additionally include other switchable mirrors that are controllable to direct the EUV light to different illumination positions with the mirrors of the illuminator 14. In some embodiments, the illuminator 14 is configured to provide an on-axis illumination (ONI) to the mask 18. In an example, a disk illuminator 14 with partial coherence σ being at most 0.3 is employed. In some other embodiments, the illuminator 14 is configured to provide an off-axis illumination (OAI) to the mask 18. In an example, the illuminator 14 is a dipole illuminator. The dipole illuminator has a partial coherence of at most 0.3 in some embodiments.

The lithography system 10 also includes a mask stage 16 configured to secure a mask 18. In some embodiments, the mask stage 16 includes an electrostatic chuck (e-chuck) to secure the mask 18. This is because gas molecules absorb EUV light, and the lithography system for the EUV lithography patterning is maintained in a vacuum environment to avoid the EUV intensity loss. In the disclosure, the terms of mask, photomask, and reticle are used interchangeably to refer to the same item.

In the present embodiment, the lithography system 10 is a EUV lithography system, and the mask 18 is a reflective mask. One exemplary structure of the mask 18 is provided for illustration. The mask 18 includes a substrate with a suitable material, such as a low thermal expansion material (LTEM) or fused quartz. In various examples, the LTEM includes $TiO_2$ doped $SiO_2$, or other suitable materials with low thermal expansion.

The mask 18 also includes a reflective ML deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light.

The mask 18 may further include a capping layer, such as ruthenium (Ru), disposed on the ML for protection. The mask 18 further includes an absorption layer deposited over the ML. The absorption layer is patterned to define a layer of an integrated circuit (IC). Alternatively, another reflective layer may be deposited over the ML and is patterned to define a layer of an integrated circuit, thereby forming a EUV phase shift mask.

The lithography system 10 also includes a projection optics module (or projection optics box (POB) 20 for imaging the pattern of the mask 18 on to a semiconductor substrate 26 secured on a substrate stage 28 of the lithography system 10. The POB 20 has refractive optics (such as for UV lithography system) or alternatively reflective optics (such as for EUV lithography system) in various embodiments. The light directed from the mask 18, diffracted into various diffraction orders and carrying the image of the pattern defined on the mask, is collected by the POB 20. The POB 20 may include a magnification of less than one (thereby the size of the "image" on a target (such as target 26 discussed below) is smaller than the size of the corresponding "object" on the mask). The illuminator 14 and the POB 20 are collectively referred to as an optical module of the lithography system 10.

The lithography system 10 also includes a pupil phase modulator 22 to modulate optical phase of the light directed from the mask. 18 so that the light has a phase distribution on a projection pupil plane 24. In the optical module, there is a plane with field distribution corresponding to Fourier Transform of the object (the mask 18 in the present case). This plane is referred to as projection pupil plane. The pupil phase modulator 22 provides a mechanism to modulate the optical phase of the light on the projection pupil plane 24. In some embodiments, the pupil phase modulator 22 includes a mechanism to tune the reflective mirrors of the POB 20 for phase modulation. For example, the mirrors of the POB 20 are switchable and are controlled to reflect the EUV light, thereby modulating the phase of the light through the POB 20.

In some embodiments, the pupil phase modulator 22 utilizes a pupil filter placed on the projection pupil plane 24. A pupil filter filters out specific spatial frequency components of the EUV light from the mask 18. Particularly, the pupil filter is a phase pupil filter that functions to modulate phase distribution of the light directed through the POB 20. However, utilizing a phase pupil filter is limited in some lithography system (such as an EUV lithography system) since all materials absorb EUV light.

As discussed above, the lithography system 10 also includes the substrate stage 28 to secure a target 26 to be patterned, such as a semiconductor substrate. In the present embodiment, the semiconductor substrate is a semiconductor wafer, such as a silicon wafer or other type of wafer. The target 26 is coated with the resist layer sensitive to the radiation beam, such as EUV light in the present embodiment. Various components including those described above are integrated together and are operable to perform lithography exposing processes. The lithography system 10 may further include other modules or be integrated with (or be coupled with) other modules.

The mask 18 and the method making the same are further described in accordance with some embodiments. In some embodiments, the mask fabrication process includes two operations: a blank mask fabrication process and a mask patterning process. During the blank mask fabrication process, a blank mask is formed by depositing suitable layers (e.g., reflective multiple layers) on a suitable substrate. The blank mask is then patterned during the mask patterning process to achieve a desired design of a layer of an integrated circuit (IC). The patterned mask is then used to transfer circuit patterns (e.g., the design of a layer of an IC) onto a semiconductor wafer. The patterns can be transferred over and over onto multiple wafers through various lithography processes. A set of masks is used to construct a complete IC.

The mask 18 includes a suitable structure, such as a binary intensity mask (BIM) and phase-shifting mask (PSM) in various embodiments. An example BIM includes absorptive regions (also referred to as opaque regions) and reflective regions, patterned to define an IC pattern to be transferred to the target. In the opaque regions, an absorber is present, and an incident light is almost fully absorbed by the absorber. In the reflective regions, the absorber is removed and the incident light is diffracted by a multilayer (ML). The PSM can be an attenuated PSM (AttPSM) or an alternating PSM (AltPSM). An exemplary PSM includes a first reflective layer (such as a reflective ML) and a second reflective layer patterned according to an IC pattern. In some examples, an AttPSM usually has a reflectivity of 2%-15% from its absorber, while an AttPSM usually has a reflectivity of larger than 50% from its absorber.

Figure 2:
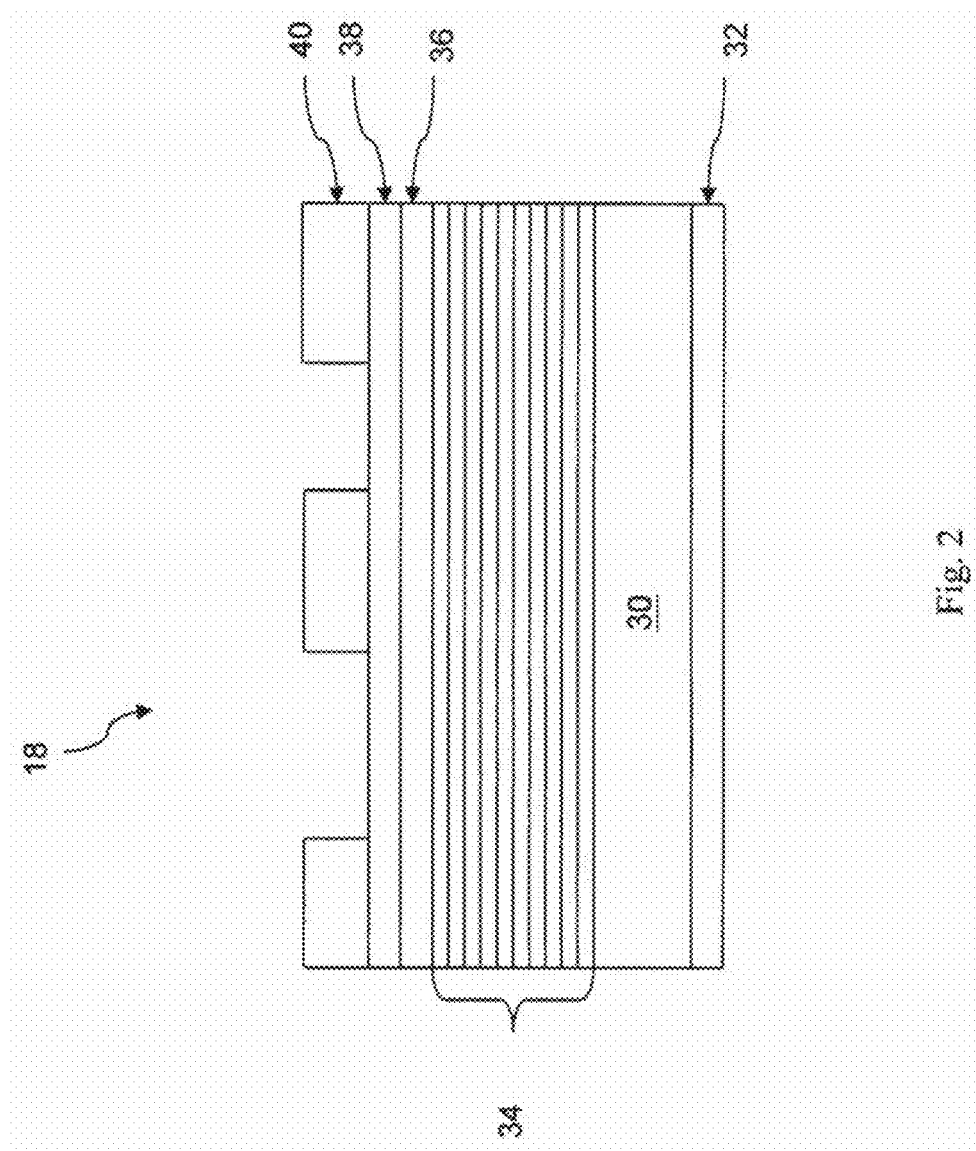
FIG. 2 is a sectional view of a EUV mask constructed in accordance with some embodiments of the present disclosure.

One example of the mask 18 is shown in FIG. 2. The mask 18 in the illustrated embodiment is a EUV mask, and includes a substrate 30 made of a LTEM. The LTEM material may include $TiO_2$ doped $SiO_2$, and/or other low thermal expansion materials known in the art. In some embodiments, a conductive layer 32 is additionally disposed under on the backside of the LTEM substrate 30 for the electrostatic chucking purpose. In one example, the conductive layer 32 includes chromium nitride (CrN), though other suitable compositions are possible.

The EUV mask 18 includes a reflective multilayer (ML) structure 34 disposed over the LTEM substrate 30. The ML structure 34 may be selected such that it provides a high reflectivity to a selected radiation type/wavelength. The ML structure 34 includes a plurality of film pairs, such as Mo/Si film pairs a layer of molybdenum above or below a layer of silicon in each film pair). Alternatively, the ML structure 34 may include Mo/Be film pairs, or any materials with refractive index difference being highly reflective at EUV wavelengths.

Still referring to FIG. 2, the EUV mask 18 also includes a capping layer 36 disposed over the ML structure 34 to prevent oxidation of the ML. In one embodiment, the capping layer 36 includes silicon with a thickness ranging from about 4 nm to about 7 nm. The EUV mask 18 may further include a buffer layer 38 disposed above the capping layer 36 to serve as an etching-stop layer in a patterning or repairing process of an absorption layer, which will be described later. The buffer layer 38 has different etching characteristics from the absorption layer disposed thereabove. The buffer layer 38 includes ruthenium (Ru), Ru compounds such as RuB, RuSi, chromium (Cr), chromium oxide, and chromium nitride in various examples.

The EUV mask 18 also includes an absorber layer 40 (also referred to as an absorption layer) formed over the buffer layer 38. In some embodiments, the absorber layer 40 absorbs the EUV radiation directed onto the mask 18. In various embodiments, the absorber layer may be made of tantalum boron nitride (TaBN), tantalum boron oxide (TaBO), or chromium (Cr), Radium (Ra), or a suitable oxide or nitride (or alloy) of one or more of the following materials: Actinium, Radium, Tellurium, Zinc, Copper, and Aluminum.

Figure 3:
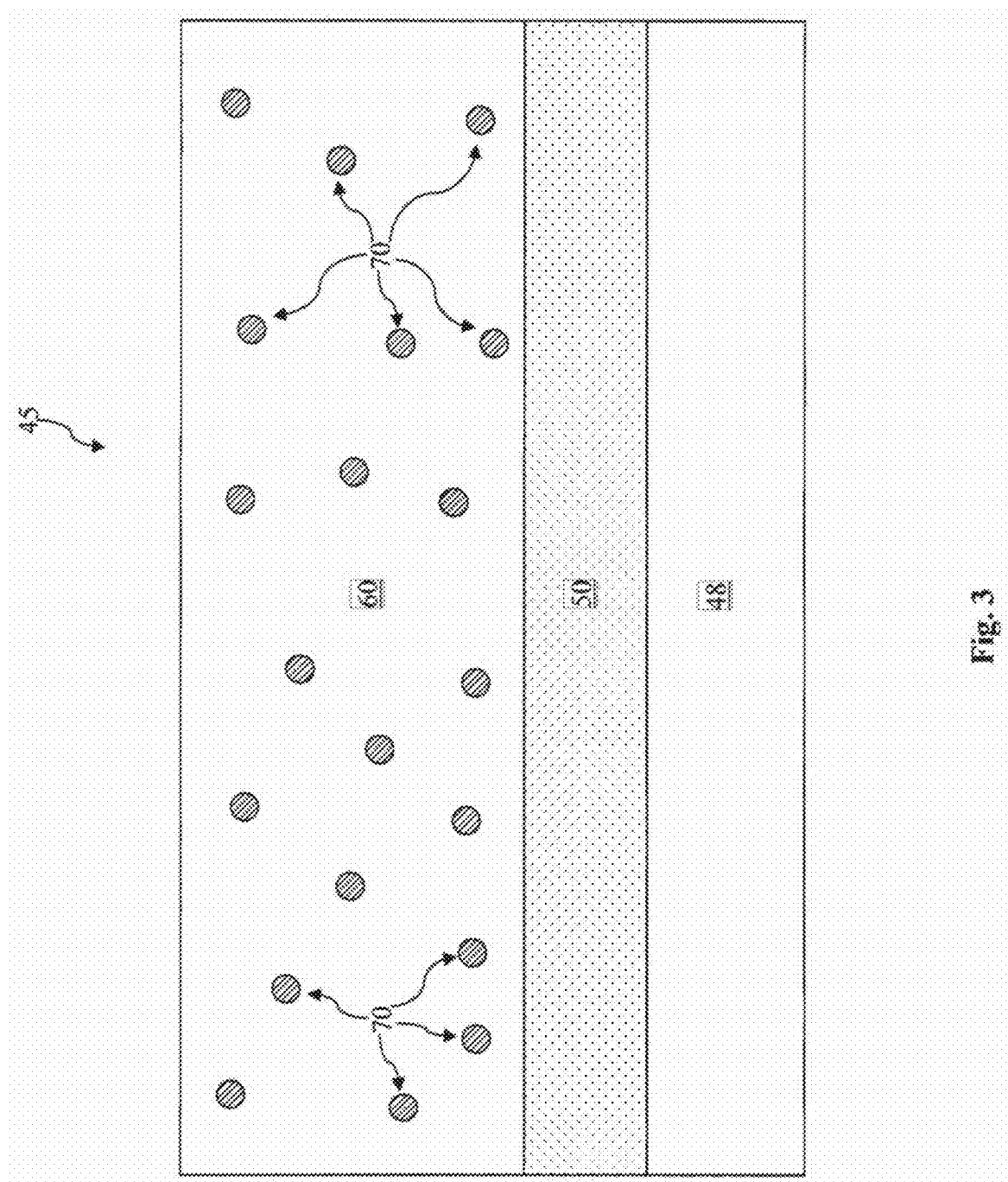
FIG. 3 is a diagrammatic cross-sectional side view of a semiconductor wafer in accordance with some embodiments of the present disclosure.

FIG. 3 is a diagrammatic fragmentary cross-sectional side view of a semiconductor wafer 45 in accordance with various aspects of the present disclosure. The semiconductor wafer 45 may include an integrated circuit (IC) chip, system on chip (SoC), or portion thereof, and may include various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, or other types of transistors.

Referring to FIG. 3, a semiconductor wafer 45 includes a substrate 48. In some embodiments, the substrate 48 is a silicon substrate doped with a p-type dopant such as boron (for example a p-type substrate). Alternatively, the substrate 48 could be another suitable semiconductor material. For example, the substrate 48 may be a silicon substrate that is doped with an n-type dopant such as phosphorous or arsenic (an n-type substrate). The substrate 48 could include other elementary semiconductors such as germanium and diamond. The substrate 48 could optionally include a compound semiconductor and/or an alloy semiconductor. Further, the substrate 48 could include an epitaxial layer (epi layer), may be strained for performance enhancement, and may include a silicon-on-insulator (SOI) structure.

In some embodiments, the substrate 48 is substantially conductive or semi-conductive. The electrical resistance may be less than about $10^3$ ohm-meter. In some embodiments, the substrate 48 contains metal, metal alloy, or metal nitride/sulfide/selenide/oxide/silicide with the formula MXa, where M is a metal, and X is N, S, Se, O, Si, and where "a" is in a range from about 0.4 to 2.5. For example, the substrate 48 may contain Ti, Al, Co, Ru, TiN, WN2, or TaN.

In some other embodiments, the substrate 48 contains a dielectric material with a dielectric constant in a range from about 1 to about 40. In some other embodiments, the substrate 48 contains Si, metal oxide, or metal nitride, where the formula is MXb, wherein M is a metal or Si, and X is N or O, and wherein "b" is in a range from about 0.4 to 2.5. For example, the substrate 48 may contain $SiO_2$, silicon nitride, aluminum oxide, hafnium oxide, or lanthanum oxide.

A material layer 50 is formed over the substrate 48. The material layer 50 can be patterned via a lithography process and as such may also be referred to as a patternable layer. In an embodiment, the material layer 50 includes a dielectric material, such as silicon oxide or silicon nitride. In another embodiment, the material layer 50 includes metal. In yet another embodiment, the material layer 50 includes a semiconductor material.

In some embodiments, the material layer 50 has different optical properties than photoresist. For example, the material layer 50 has a different n, k, or T value from photoresist. In some embodiments, the material layer 50 comprises at least one of different polymer structure, acid labile molecule, PAG (photo acid generator), quencher, chromophore, cross linker, or solvent, which lead to different n value to photoresist. In some embodiments, the material layer 50 and photoresist have different etching resistance. In some embodiments, the material layer 50 contains an etching resistant molecule. The molecule includes low onishi number structure, double bond, triple bond, silicon, silicon nitride, Ti, TiN, Al, aluminum oxide, SiON, or combinations thereof.

It is understood that the substrate 48 and the material layer 50 may each include additional suitable material compositions in other embodiments.

A photoresist layer 60 is formed over the material layer 50. In the embodiment shown in FIG. 3, the photoresist layer 60 includes a positive photoresist, but it is understood that the photoresist layer 60 may be a negative photoresist in alternative embodiments. The photoresist layer 60 may be formed by a spin-coating process. The photoresist layer 60 contains components such as a polymer, photo acid generators (PAG), quenchers, chromophore, surfactant, cross linker, etc. In an embodiment, the photo acid generator is bonded to the polymer. In a subsequent photolithography process, photons induce decomposition of the PAG. As a result, a small amount of acid is formed, which further induces a cascade of chemical transformations in the photoresist layer 60. The photoresist layer 60 may also optionally include a quencher that is disposed within the photoresist layer 60 in order to improve critical dimension (CD) control.

The photoresist layer 60 contains a photo-acid generator (PAG). In some embodiments, the photo-acid generator includes an acid generator component and a sensitizer component. The sensitizer component is also referred to as a sensitizer moiety, and it is bonded or linked to the acid generator through a linker.

In some embodiments, the photoresist layer 60 may be a tri-layer photoresist. A tri-layer photoresist may include a bottom layer (also referred to as an under layer), a middle layer, and a top layer (the top layer may also be referred to as a PR layer). In some embodiments, the bottom layer includes a CxHyOz material, the middle layer includes a SiCxHyOz material, and the top layer includes a CxHyOz material. The CxHyOz material of the bottom layer may be identical to the CxHyOz material of the top layer in some embodiments, but they may also be different in other embodiments. The top layer also includes a photo-sensitive element, such as a photo-acid generator (PAG). This allows a photolithography process to be performed to pattern the top layer. Typically, the top layer is patterned by a photolithography process, which may include one or more exposure, baking, developing, and rinsing processes (not necessarily performed in this order). The photolithography process patterns the top layer into a photoresist mask, which may have one or more trenches or openings that expose the middle layer therebelow. The middle layer is then etched using the photoresist mask to form a patterned middle layer, and the bottom layer is then etched using the patterned middle layer to form a patterned bottom layer. The patterned bottom layer is then used to pattern the various layers below.

As discussed above, photon absorption has been a problem in EUV lithography if conventional organic photoresist is used. Therefore, the photoresist layer 60 shown in FIG. 3 has metal-containing (or metal-compound-containing) material 70 added therein. In some embodiments, the metal-containing material 70 includes Caesium (Cs), Barium (Ba), Lanthanum (La), Indium (In), Cerium (Ce), Silver (Ag), or Tin (Sn), or combinations or compounds thereof. In embodiments where the photoresist layer 60 is a tri-layer photoresist, the metal-containing material 70 may be located in any one of the bottom layer, the middle layer, the top layer, or in all of these layers.

The metal-containing material 70 helps enhance the photon absorption in EUV lithography. However, as discussed above, the metal-containing material 70 may cause contamination problems. Therefore, the present disclosure will remove the metal-containing particles after (or during) the photoresist layer 60 has been used to perform EUV lithography patterning.

Figure 4:
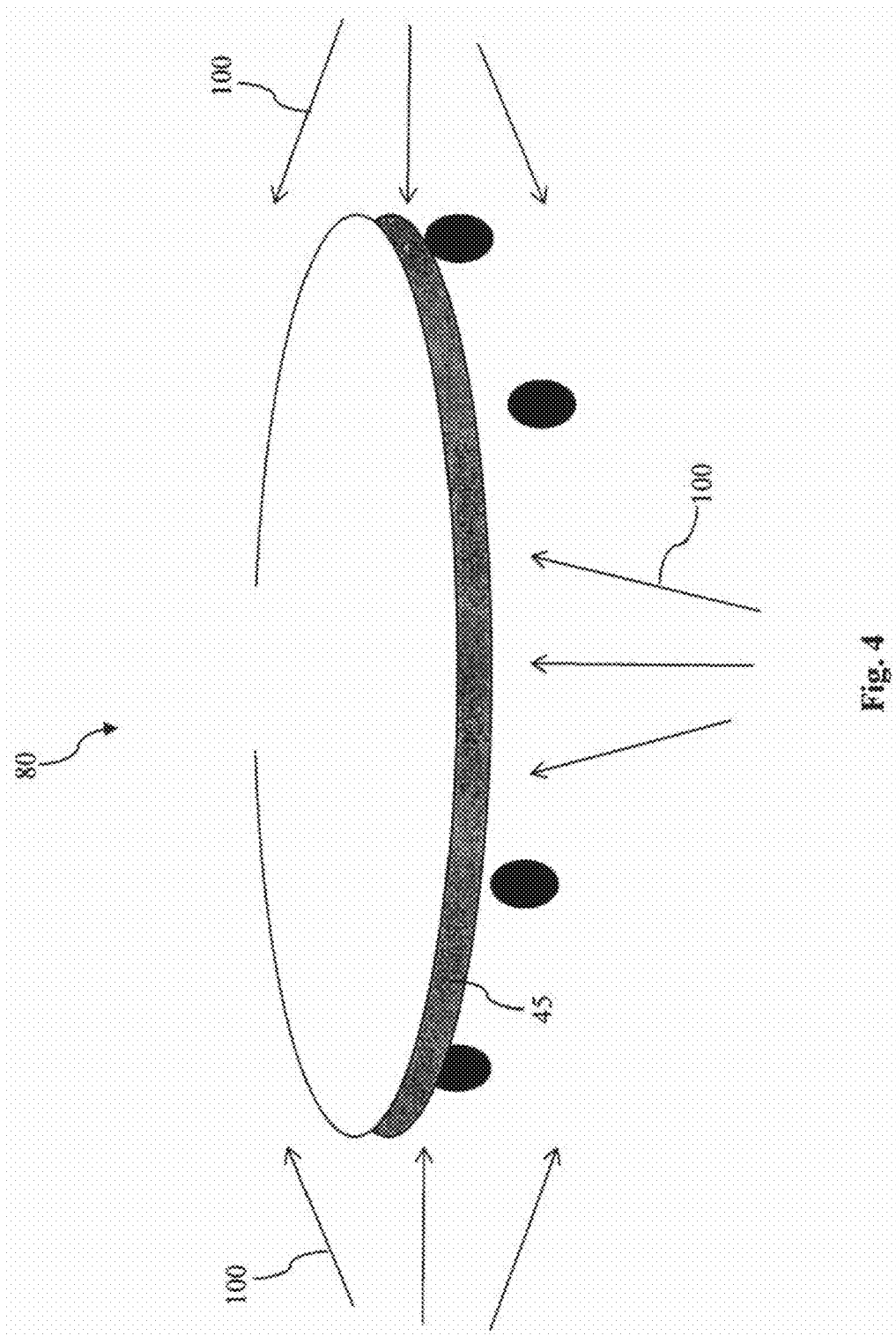
FIGS. 4-6 illustrate different flows of cleaning a wafer to remove a metal-containing contaminant according to embodiments of the present disclosure.

FIG. 4 illustrates a flow of cleaning the wafer 45 to remove the contaminant metal-containing material 70 according to an embodiment of the present disclosure. As is shown in FIG. 4, a material 80 is dispensed on the wafer 45. The material 80 may include a photoresist specifically configured for EUV lithography, which as discussed above includes a metal-containing material such as the metal-containing material 70 shown in FIG. 3. The material 80 may also include a developer solution that is used to develop the photoresist.

A cleaning fluid 100 is applied to the wafer 45 to remove the metal-containing material 70. The cleaning fluid 100 is applied to a back side of the wafer 45 and/or the side edges of the wafer 45. This is because the wafer transferring process (e.g., as the wafer 45 is transferred out of the one semiconductor fabrication tool to another semiconductor fabrication tool) may involve physical contact with the back side or the side edges of the wafer 45. For example, as the wafer 45 is transferred out of a semiconductor fabrication tool (which may be a EUV lithography apparatus in an embodiment), various components of the semiconductor fabrication tool may come into contact with the bottom (e.g., back side) or side portions of the wafer 45. Through such contact, the metal-containing material 70 (FIG. 3) may be left on the semiconductor fabrication tool. If a subsequent process performed by that semiconductor fabrication tool is supposed to be metal-free, then the metal-containing material 70 may be considered a contaminant.

As another example, if the metal-containing material 70 is not thoroughly cleaned off of the wafer 45, the metal-containing material 70 may contaminate a new semiconductor fabrication tool as the wafer is loaded into the new semiconductor fabrication tool. This may be exacerbated by various heating processes, which facilitate the escape of the metal-containing material 70 from the wafer 45. The new (and now contaminated) semiconductor fabrication tool may be intended to perform a semiconductor fabrication process in a metal-free environment, in which case the presence of the metal-containing material 70 therein is undesirable. For these reasons, the metal-containing material 70 is cleaned off using the cleaning fluid 100. To enhance the effectiveness of the cleaning, the cleaning fluid 100 is configured to mostly target the back side and the side edges of the wafer 45, although the front side of the 45 may be optionally cleaned as well.

The material compositions of the cleaning fluid 100 are carefully configured to enhance the removal of the metal-containing material 70 from the wafer 45. For example, the cleaning fluid 100 contains a solvent that is selected to have specific ranges with respect to Hansen solubility parameters of delta D, delta P, and delta H. Hansen solubility parameters provide a way to predict whether one material will dissolve in another and form a solution. A molecule of a given material has three Hansen parameters (each generally measured in $MPa^{0.5}$) delta D, delta P, and delta H. Delta D is the energy from dispersion forces between molecules. Delta P is the energy from dipolar intermolecular force between molecules. Delta H is the energy from hydrogen bonds between molecules. These three delta parameters may be viewed as coordinates for a point in a three-dimensional "Hansen space". The nearer two molecules are in this three-dimensional "Hansen space", the more likely they are to dissolve into each other.

According to the various aspects of the present disclosure, the solvent is configured to have specific ranges of Hansen parameters so that the metal-containing material 70 can be easily dissolved and consequently removed. In some embodiments, the solvent's Hansen parameters are such that a delta D is in a range from 13 to 25, a delta P is in a range from 3 to 25, and a delta H is in a range from 4 to 30. In some other embodiments, the solvent's Hansen parameters are such that a delta D is in a range from 15 to 22, a delta P is in a range from 3.5 to 17, and a delta H is in a range from 5 to 16.

In some embodiments, the solvent is an aqueous solvent. A water-soluble acid or water-soluble base may be added to the aqueous solvent to enhance the ability of the solvent in removing the metal-containing material 70. The concentration of the acid or base in the aqueous solvent may be in a range from 0.001% to 30%, for example in a range between 0.1% and 20%. In some embodiments, the concentration of the acid or base in the aqueous solvent is in a range from 0.1% to 10%. If an acid is used, a pka (acid dissociation constant, also referred to an acidity constant or acid-ionization constant, which is a logarithmic value herein) of the acid is in a range from −11 to 4, for example from −11 to 3. Non-limiting examples of the aqueous acid may include $H_2SO_4$, $HNO_3$, HCl, $H_3PO_4$, $CCl_3COOH$, HBr, or combinations thereof. If a base is used, the pka of the base is in a range from 9 to 40, for example from 10-20. Non-limiting examples of the aqueous base may include NaOH, $NH_3$, KOH, TMAH, TEAH, or combinations thereof. In some embodiments, a metal chelate may be added to the aqueous solvent addition to, or instead of, the acid or base. In these embodiments, the concentration of the metal chelate in the aqueous solvent may be in a range from 0.001% to 30%, for example in a range between 0.1% and 20%. Non-limiting examples of the metal chelate may include ethylenediaminetetraacetic acid (EDTA), ethylenediamine-N, N'-disuccinic acid (EDDS), diethylenetriaminepentaacetic acid (DTPA), polyaspartic acid, trans-1, 2-Cyclohexanediamine-N, N, N', N'-tetraacetic acid monohydrate, ethylenediamine, or combinations thereof. In some embodiments, the aqueous solvent may also be heated to increase the cleaning efficiency. In some embodiments, the aqueous solvent is heated in a temperature ranging between room temperature (e.g., 25 degrees Celsius) and 75 degrees Celsius, for example between 45 and 75 degrees Celsius. In some embodiments, surfactants may also be added to the aqueous solvent to increase the solubility and/or to reduce the surface tension on the wafer 45. The concentration of the surfactant in the aqueous solvent may be in a range from 0.1% to 5%. It is understood that the various ranges the materials discussed herein are configured to enhance the efficacy of the solvent, for example the efficacy with respect to cleaning the metal-containing material 70 off of the wafer 45.

In some embodiments, the solvent is an organic solvent. The organic solvent may have a polar function, such as —OH, —COOH, —CO—, —O—, —COOR, —CN—, —SO—, as non-limiting examples. In various embodiments, the organic solvent may include PGME, PGEE, GBL, CHN, EL, Methanol, Ethanol, Propanol, n-Butanol, Acetone, DMF, Acetonitrile, IPA, THF, Acetic acid, or combinations thereof. An organic acid or organic base may be added to the organic solvent to enhance the ability of the solvent in removing the metal-containing material 70. The concentration of the acid or base in the organic solvent may be in a range from 0.001% to 30%, for example in a range between 0.1% and 20%. If an acid is used, a pka (acid dissociation constant, also referred to an acidity constant or acid-ionization constant, which is a logarithmic value herein) of the acid is in a range from −11 to 4. Non-limiting examples of the organic acid may include ethanedioic acid, methanoic acid, 2-hydroxypropanoic acid, 2-hydroxybutanedioic acid, citric acid, uric acid, trifluoromethanesulfonic acid, benzenesulfonic acid, ethanesulfonic acid, methanesulfonic acid, oxalic acid dihydrate, maleic acid, or combinations thereof.

If a base is used, the pka of the base is in a range from 9 to 40. Non-limiting examples of the organic base may include monoethanolamine, monoisopropanolamine, 2-amino-2-methyl-1-propanol, 1H-benzotriazole, 1, 4-triazole, 1, 8-diazabicycloundec-7-ene or combinations thereof. In some embodiments, a metal chelate may be added to the organic solvent addition to, or instead of, the acid or base. In these embodiments, the concentration of the metal chelate in the organic solvent may be in a range from 0.001% to 30%. Non-limiting examples of the metal chelate may include ethylenediaminetetraacetic acid EDTA), ethylenediamine-N, N'-disuccinic acid (EDDS), diethylenetriaminepentaacetic acid (DTPA), polyaspartic acid, trans-1, 2-Cyclohexanediamine-N, N, N', N'-tetraacetic acid monohydrate, ethylenediamine, or combinations thereof. In some embodiments, the organic solvent may also be heated to increase the cleaning efficiency. In some embodiments, the organic solvent is heated in a temperature ranging between room temperature (e.g., 25 degrees Celsius) and 75 degrees Celsius. In some embodiments, surfactants may also be added to the organic solvent to increase the solubility and/or to reduce the surface tension on the wafer 45. The concentration of the surfactant in the organic solvent may be in a range from 0.1% to 5%. It is understood that the various ranges the materials discussed herein are configured to enhance the efficacy of the solvent, for example the efficacy with respect to cleaning the metal-containing material 70 off of the wafer 45.

Figure 5:
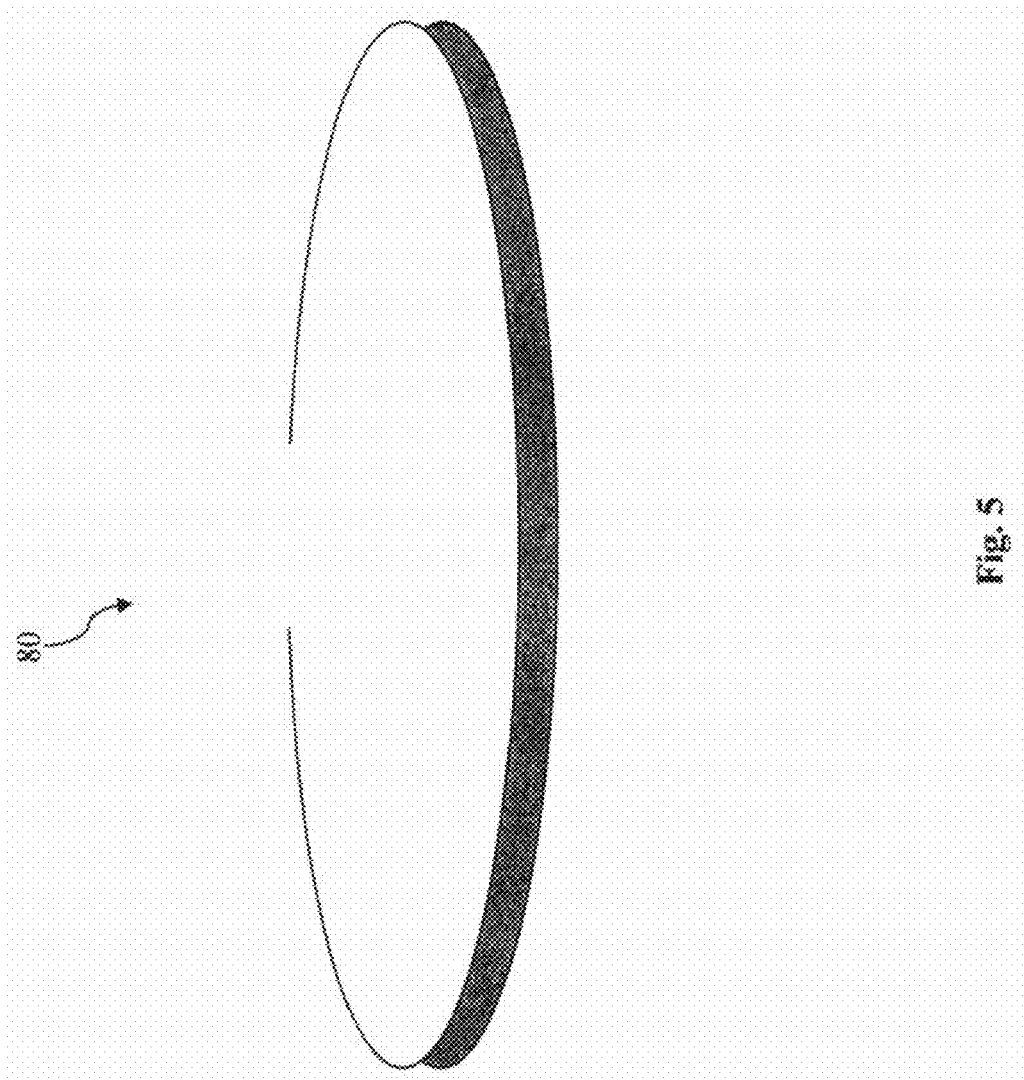
Figure 6:
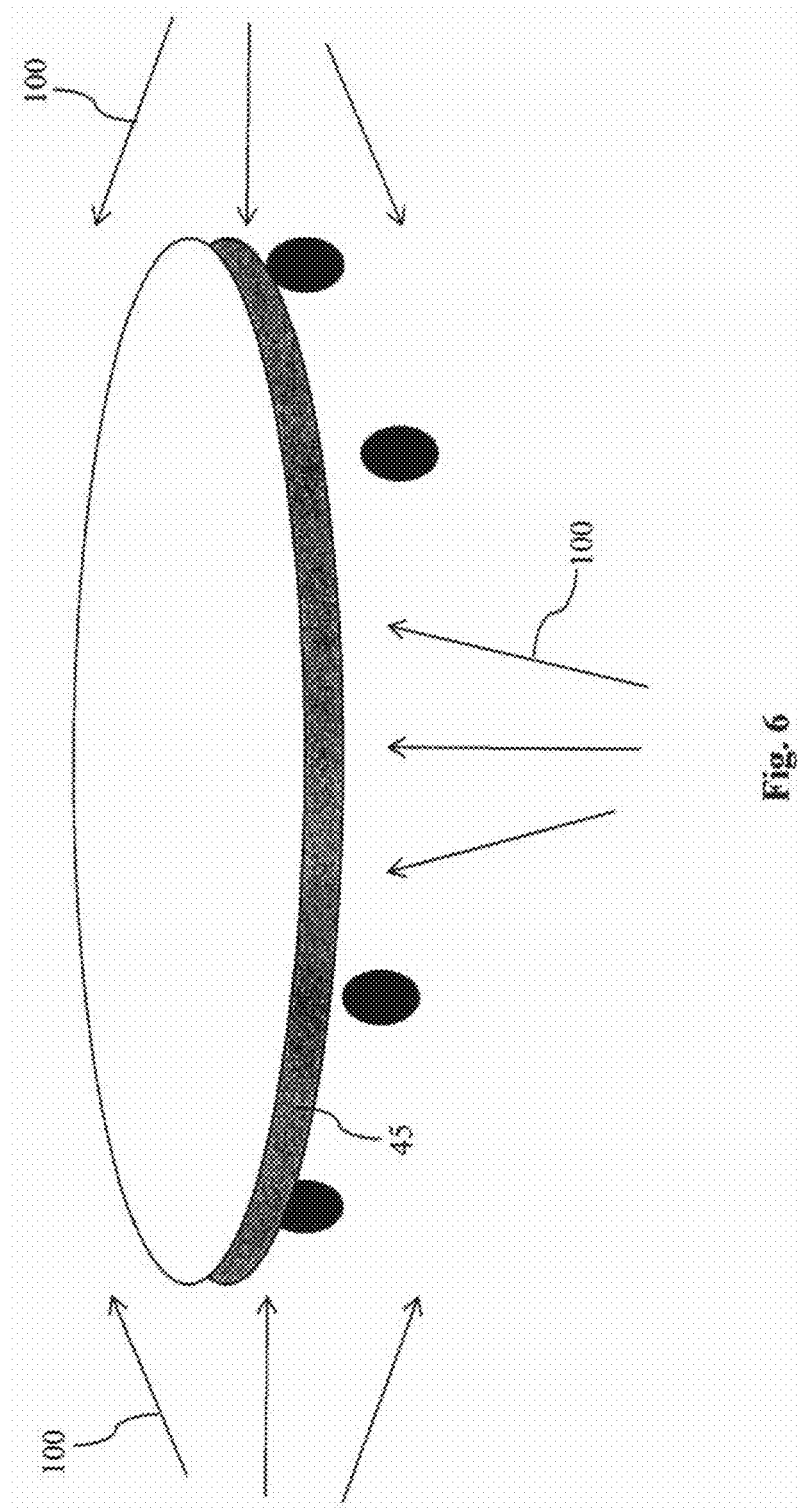

FIGS. 5-6 illustrate a flow of cleaning the wafer 45 to remove the contaminant (e.g., the metal-containing material 70) according to an alternative embodiment of the present disclosure. For reasons of consistency and clarity, similar components appearing in FIGS. 4-6 are labeled the same. As is shown in FIG. 5, the material 80 is dispensed on the wafer 45. As discussed above with reference to FIG. 4, the material 80 may include a metal-containing photoresist specifically configured for EUV lithography (for better photon absorption), and/or it may also include a developer solution. While the material 80 is applied on the wafer 45, the cleaning fluid 100 is not applied yet.

Referring now to FIG. 6, the cleaning fluid 100 is applied to the wafer 45 to remove the metal-containing material 70. The cleaning fluid 100 is mostly applied to a back side of the wafer 45 and/or the side edges of the wafer 45, and may be optionally applied to the front side of the wafer 45 in some embodiments. As discussed above with reference to FIG. 4, the cleaning fluid 100 includes an aqueous or organic solvent having a particular range of Hansen solubility parameters to facilitate the removal of the metal-containing material 70. Various additives such as acid, base, or metal chelate may also be added to the solvent as discussed above, to further enhance the efficacy of the cleaning fluid 100 in removing the metal-containing material 70. Thus, whereas the flow corresponding to FIG. 4 is configured to remove the metal-containing material 70 as the metal-containing material 70 is being dispensed (in the photoresist), the flow corresponding to FIGS. 5-6 is configured to remove the metal-containing material 70 via an extra cleaning step.

Figure 7:
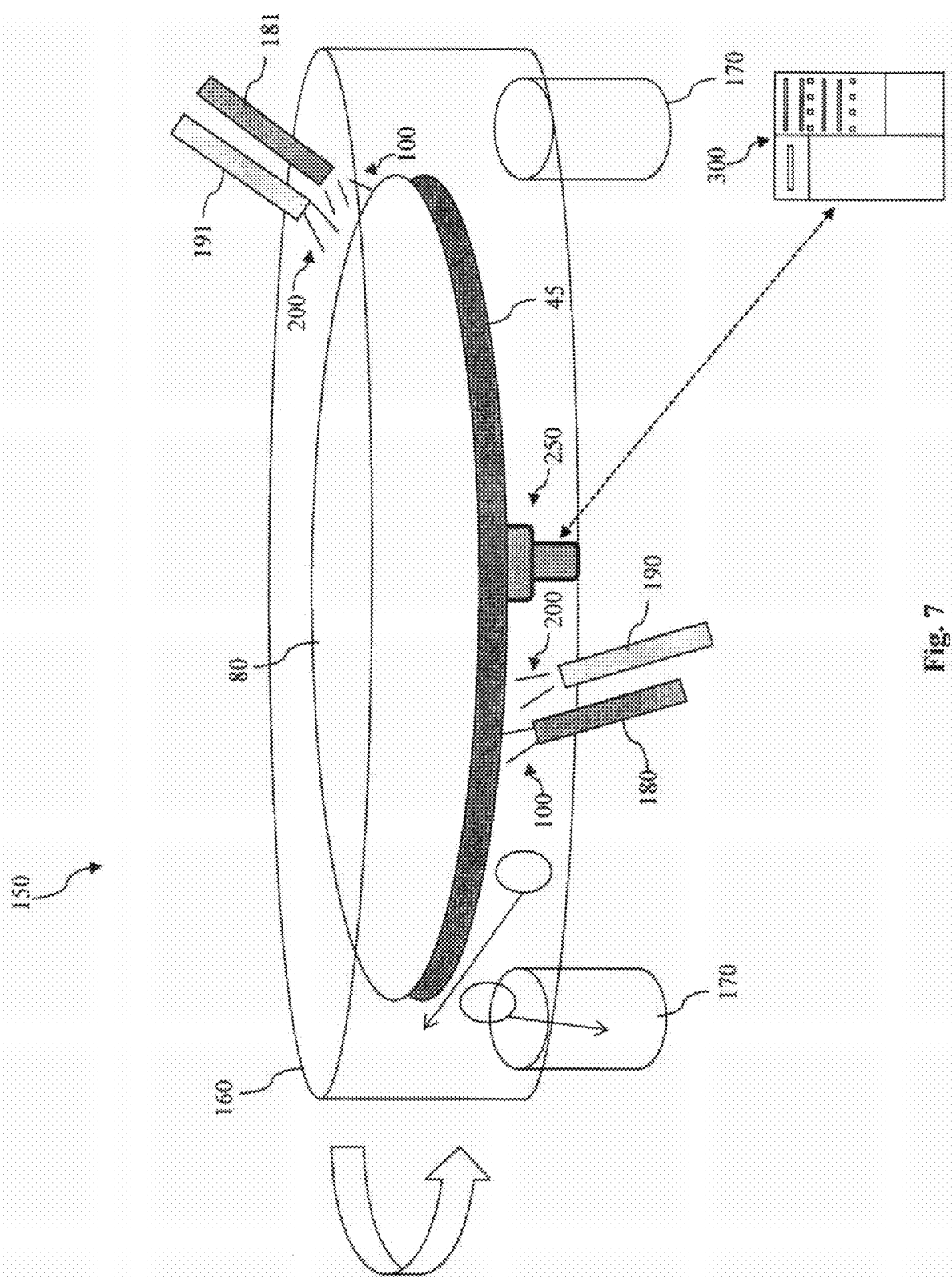
FIG. 7 illustrates an embodiment of a cleaning system for cleaning a wafer to remove a metal-containing contaminant according to embodiments of the present disclosure.

Referring now to FIG. 7, an embodiment of a cleaning system 150 is illustrated. In some embodiments, the cleaning system 150 may be a part of an existing semiconductor fabrication apparatus, for example it may be integrated into an EUV lithography tool where metal-containing photoresist is used for EUV lithography. In other embodiments, the cleaning system 150 may be a part of other types of semiconductor fabrication equipment where metal contaminants may be introduced. In the embodiment shown in FIG. 7, the material 80 (e.g., a metal-containing EUV photoresist and/or a developer solution) is dispensed on the front side of the wafer 45. The metal in the material 80 may be considered a contaminant and will be removed by the cleaning system 150, as discussed below.

The cleaning system 150 includes a chamber 160 in which the wafer 45 is disposed. In some embodiments, the chamber is sealable so as to isolate the wafer 45 from other potential contaminants outside the chamber 160. The cleaning system 150 may also include one or more exhaust mechanisms 170 that are coupled to the chamber 160 such that fluids (e.g., air, which may include contaminant particles) from inside the chamber 160 may be "sucked" out of the chamber 160. In other words, a negative pressure is applied to the exhaust mechanisms 170 to create at least a partial vacuum inside or near the exhaust mechanisms 170. The negative pressure applied to the exhaust mechanisms 170 will force the fluids such as air inside the chamber 160 to flow toward, and then out of, the exhaust mechanisms 170.

The cleaning system 150 further includes a plurality of nozzles 180 and 181 that are each configured to spray the cleaning fluid 100 discussed above with reference to FIGS. 4-6. In more detail, the nozzle 180 is positioned below the wafer 45 and is therefore configured to spray the cleaning fluid 100 onto the back side of the wafer 45. The nozzle 181 is positioned near a side edge of the wafer 45 and is therefore configured to spray the cleaning fluid 100 onto the side edge of the wafer 45.

It is understood that although two nozzles 180-181 are illustrated herein to spray the cleaning fluid 100, the cleaning system 150 may include other nozzles that are also configured to spray the cleaning fluid 100 onto the wafer 45. For example, more than one nozzle may be positioned below the wafer 45, more than one nozzle may be positioned around different side edge points of the wafer 45, and one or more nozzles may also be positioned above the wafer 45 to spray the cleaning fluid 100 onto the front side of the wafer 45. In any case, the cleaning fluid 100 sprayed by the nozzles 180-181 (and other similar nozzles) herein will wash the metal-containing material 70 away from the wafer 45, for example away from the back surface and the side surfaces of the wafer 45.

To facilitate the removal of the metal-containing material 70 from the wafer 45, the cleaning system 150 also includes nozzles 190 and 191 that are each configured to deliver a suitable purging fluid 200 (e.g., air) to the wafer 45. In more detail, the nozzle 190 is positioned below the wafer 45 and is therefore configured to apply the purging fluid 200 onto the back side of the wafer 45. The nozzle 191 is positioned near a side edge of the wafer 45 and is therefore configured to spray the purging fluid 200 onto the side edge of the wafer 45. Positive pressure is applied through the nozzles 190-191 to ensure that the purging fluid 200 spurts out of the nozzles 190-191 and makes contact with the wafer 45. In some embodiments, a magnitude (or absolute value) of the positive pressure applied through the nozzles 190-191 exceeds the magnitude (or absolute) value of the negative pressured applied through the nozzles 180-181. In some embodiments, the purging fluid 200 includes clean dry air (CDA). In other embodiments, the purging fluid 200 includes nitrogen. In yet other embodiments, the purging fluid 200 includes another suitable material that does not react with films on the wafer 45.

The interaction between the purging fluid 200 and the wafer enhances the effectiveness of the washing or the removal of contaminant particles, including the removal of the metal-containing material 70. In this manner, the nozzles 190-191 "pushes", and the exhaust mechanisms 170 "pulls" the metal containing-material 70 off of the wafer 45 and out of the chamber 160.

It is understood that although two nozzles 190-191 are illustrated herein to deliver the purging fluid 200, the cleaning system 150 may include other nozzles that are also configured to deliver the purging fluid 200 onto the wafer 45, For example, more than one nozzle may be positioned below the wafer 45, more than one nozzle may be positioned around different side edge points of the wafer 45, and one or more nozzles may also be positioned above the wafer 45 to deliver the purging fluid 200 onto the front side of the wafer 45. In some embodiments, a respective purging fluid nozzle (e.g., nozzles 190-191) is located adjacent to a respective cleaning fluid nozzle (e.g., nozzles 180-181). In any case, the purging fluid 200 delivered by the nozzles 190-191 (and other similar nozzles) herein will help wash the metal-containing material 70 away from the wafer 45, for example away from the back surface and the side surfaces of the wafer 45.

In addition to implementing the cleaning fluid nozzles 180-181 and the purging fluid nozzles 190-191, the cleaning system 150 also has mechanisms in place to spin the wafer 45 during the cleaning process, such as during the application of the cleaning fluid 100 and/or the purging fluid 200. For example, the cleaning system 150 may include a spinner apparatus 250. The spinner apparatus 250 may include a chuck, a pedestal, and/or a motor. The spinner apparatus is mechanically coupled to the wafer 45, and it is configured to rotate or spin in a clockwise and/or a counterclockwise manner. Thus, as the spinner apparatus 250 rotates or spins, so does the wafer 45.

To control the spin of the spinner apparatus 250, the cleaning system 150 may include a controller 300 that is communicatively coupled to the spinner apparatus 250. The controller 300 may be remotely located (or locally located) from the rest of the cleaning system 150. In other words, the controller 300 may be implemented outside the chamber 160 in some embodiments, and it may be implemented inside the chamber 160 in other embodiments. The controller 300 may also be a part of an overall semiconductor manufacturing system, of which the cleaning system 150 is a part. The controller 300 may include electronic memory and one or more electronic processors configured to execute programming instructions stored in the electronic memory, which may involve a program controlling the spin of the spinner apparatus 250. The controller 300, based on the program, controls the spinner apparatus (and therefore the wafer 45) to rotate or spin according to a specific spin speed, spin duration, and/or a spin direction (e.g., clockwise or counterclockwise). In some embodiments, the controller 300 is configured to set a spin rate/speed of the wafer in a range between about 800 RPM to about 4500 RPM, for example between about 800 RPM and about 3500 RPM. This range of the spin speed is optimized to enhance the distribution of the cleaning fluid 100 on the wafer 45 and to facilitate the removal of the contaminant materials such as the metal-containing material 70.

It is understood that the spinning of the wafer 45 need not be only in one direction. Instead of performing the spin in just a clockwise direction or just in a counterclockwise direction, the wafer 45 (under the control of the controller 300) may undergo a combination of clockwise and counterclockwise spins. For example, the wafer 45 may be configured to spin in a clockwise direction for an X number of seconds, followed by a spin in the counterclockwise direction for a Y number of seconds (where Y may be the same as X or may be different), or vice versa. The combination of performing clockwise spins and counterclockwise spins in an alternating manner may further enhance the application of the cleaning fluid 100 and the purging fluid 200 with respect to the wafer 45, thereby improving the removal of the metal-containing materials as contaminants.

Figure 8:
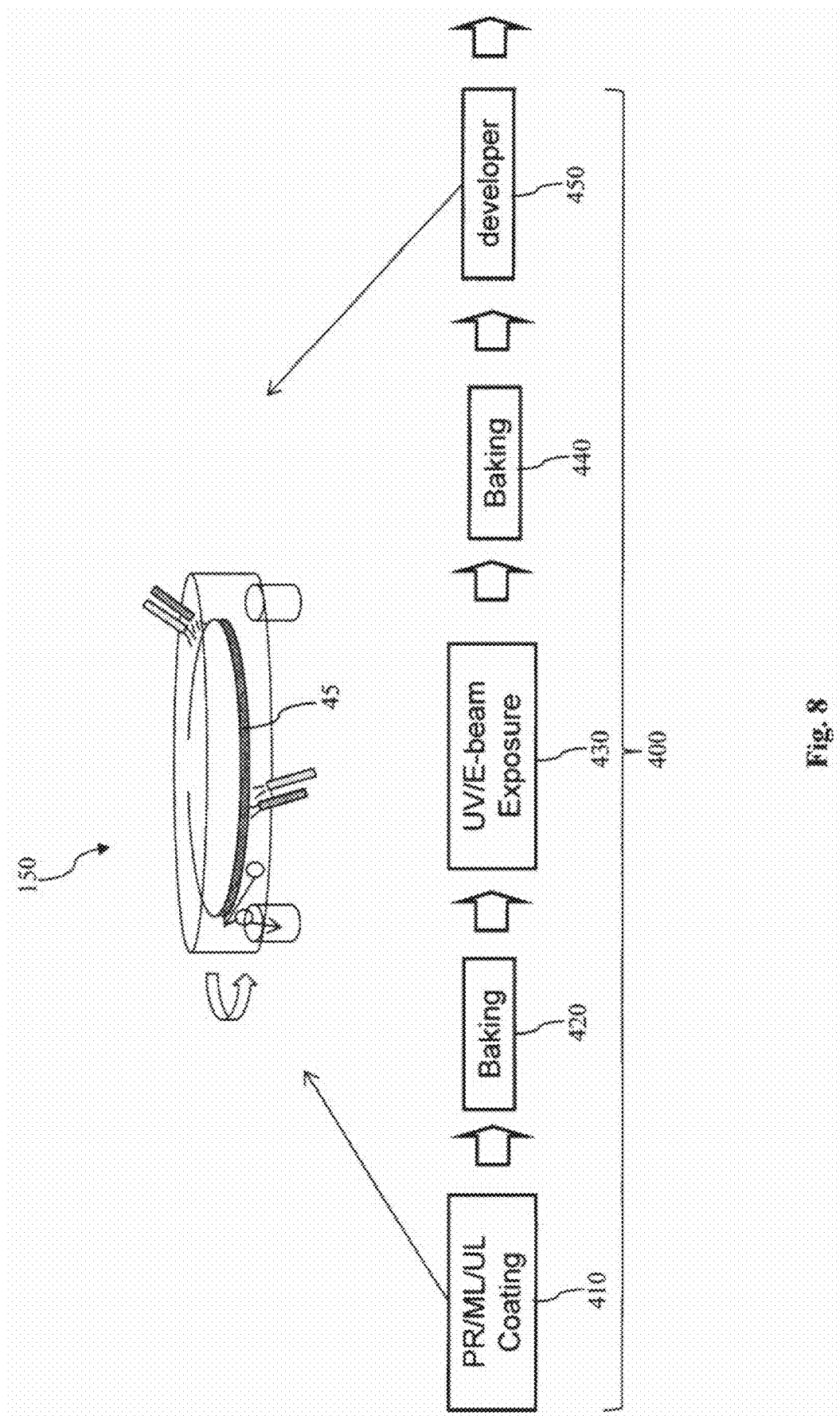
FIGS. 8-9 provide visual illustrations of different flows in which a cleaning process is performed according to embodiments of the present disclosure.

FIG. 8 provides a visual illustration of a flow in which the cleaning process is performed according to embodiments of the present disclosure. Referring to FIG. 8, an example lithography process 400 is illustrated. In some embodiments, the lithography process 400 is an EUV lithography process. The lithography process 400 includes a step 410 in which a photo-sensitive material is coated onto a wafer such as the wafer 45. The photo-sensitive material lay include a tri-layer photoresist (including a top layer (PR), a middle layer (ML), and an under layer (UL)). The photo-sensitive material may be coated via a spin-coating process. As discussed above, to enhance the photon absorption, the photo-sensitive material contains metal, which are considered contaminants after the lithography process is performed and should be removed.

The lithography process 400 includes a step 420 of pre-exposure baking, in which the wafer (and the metal-containing photo-sensitive material coated thereon) is baked. The lithography process 400 includes a step 430 of exposure, in which the wafer (and the metal-containing photo-sensitive material coated thereon) is exposed. In some embodiments, the exposure involves using ultraviolet (UV) light or using e-beam to expose the wafer 45. The lithography process 400 includes a step 440 of post-exposure bake, in which the wafer 45 (and the metal-containing photo-sensitive material coated thereon) is baked. The lithography process 400 includes a step 450 of developing, in which the wafer (and the metal-containing photo-sensitive material coated thereon) is developed via an application of a developer solution onto the wafer. It is understood that the lithography process 400 may include additional processes that are not specifically illustrated or discussed herein.

According to the process flow in FIG. 8, the wafer 45 is cleaned, using the cleaning system 150 discussed above with reference to FIG. 7, while the steps 410 and 450 are performed. In other words, as the metal-containing photo-sensitive material is applied to the wafer 45, the wafer 45 is cleaned using the cleaning system 150. In addition, as the developed solution is applied to the wafer 45 to develop the exposed photo-sensitive material, the wafer 45 is also cleaned using the cleaning system 150. It is understood, however, that according to this process flow, the wafer 45 need not necessarily be cleaned twice. For example, the wafer 45 may be cleaned just during the step 410, or alternatively it may be cleaned just during the step 450, but not necessarily during both steps 410 and 450.

Figure 9:
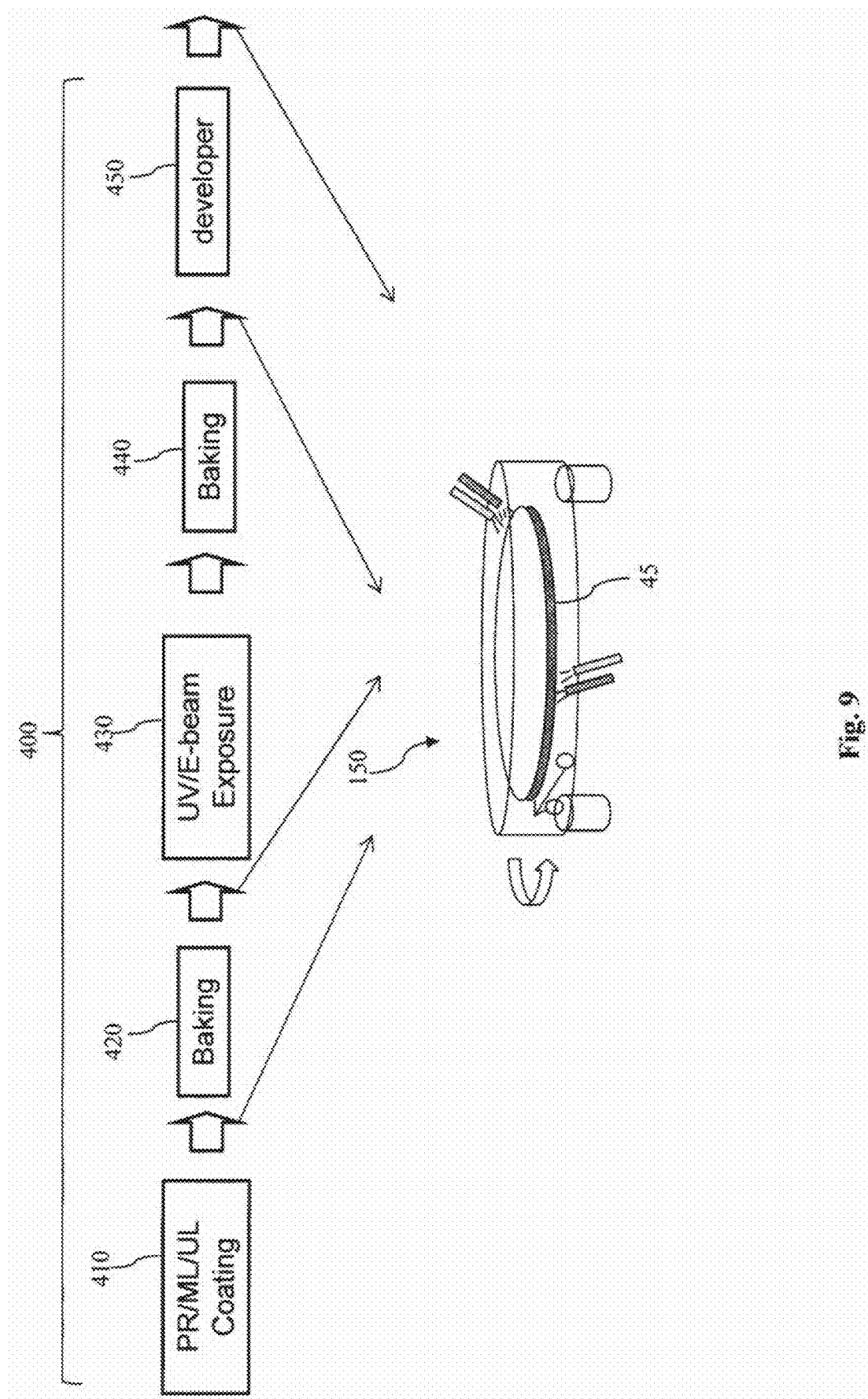

FIG. 9 provides another visual illustration of another flow in which the cleaning process is performed according to embodiments of the present disclosure. For reasons of consistency and clarity, similar elements appearing in FIGS. 8-9 are labeled the same. In comparison to the process flow shown in FIG. 8, the process flow shown in FIG. 9 performs the wafer cleaning after the steps 410, 420, 440, and 450, rather than during the steps 410 and 450. In other words, the wafer 45 may be cleaned (using the cleaning system 150) after the metal-containing photo-sensitive material has been coated onto the wafer, and/or after the pre-exposure baking process, and/or after the post-exposure baking process, and/or after the developing process. Again, it is understood that the wafer 45 need not necessarily be cleaned four times in this process flow. For example, the wafer 45 may be cleaned (using the cleaning system 150) just after any one of the steps 410, 420, 440, and 450, or combinations thereof.

It is understood that although the discussions above have focused on cleaning the wafer to remove a metal contaminant arising from a metal-containing EUV photoresist, the systems and method discussed herein is not limited to this particular context. The systems and methods of the present disclosure can also be used in other semiconductor fabrication situations where metal may be considered a contaminant and needs to be removed.

Figure 10:
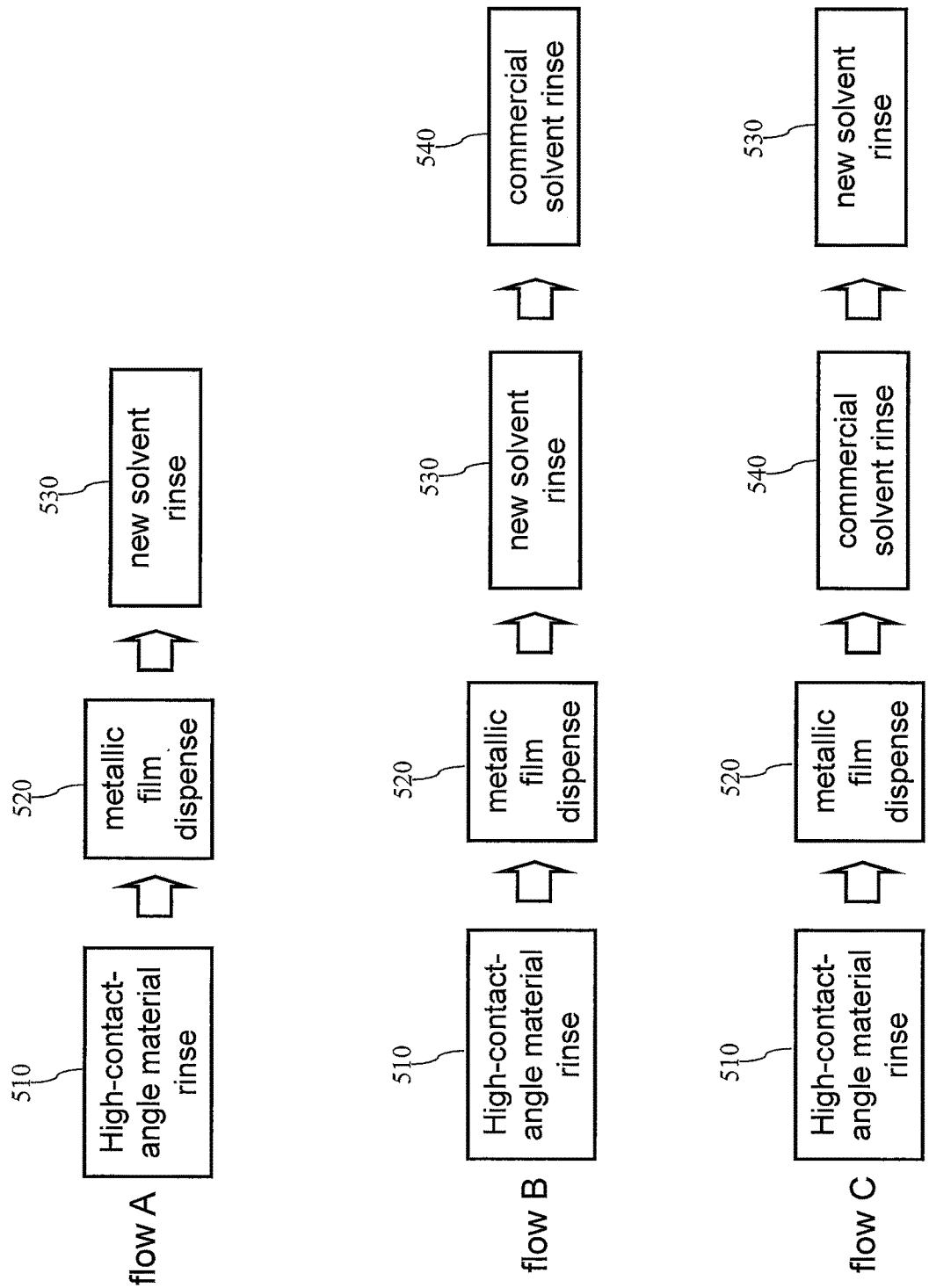
FIG. 10 is a diagrammatic illustration of various process flows according to embodiments of the present disclosure.

It is also understood that an additional step of rinsing the wafer with a high-contact-angle material may be optionally performed in some embodiments. This is diagrammatically illustrated in FIG. 10, which illustrates several different process flows according to embodiments of the present disclosure. Referring to FIG. 10, a flow A includes a step 510 of performing a high-contact-angle material rinsing process to the wafer, for example the wafer 45 discussed above. The rinse may be applied to a backside or an edge of the wafer. The high-contact-angle material may include a material that has a contact angle that is greater than 75% with respect to water. After the wafer surface is treated with the high-contact-angle material, the wafer surface becomes hydrophobic. Since this is done before the photoresist layer is coated on the wafer surface, it makes the subsequent wafer cleaning easier. In other words, the hydrophobicity of the wafer surface (due to the application of the high-contact-angle material in step 510) allows the metal-containing material in the photoresist to be more easily washed off of the wafer.

Still referring to FIG. 10, a step 520 is performed after the high-contact-angle material rinse step of 510. In step 520, a metallic film is dispensed. The metallic film may be the metal-containing material in the photoresist discussed above. Thus, step 520 may involve coating a metal-containing photoresist material on the wafer surface.

A step 530 is performed after the step 520. The step 530 involves a new solvent rinsing process, The new solvent may be embodiments of the cleaning fluid 100 discussed above, for example containing a solvent with the specified ranges of Hansen parameters. Again, the step 530 allows the metal-containing material to be washed off of the wafer, which reduces risks of contamination.

Flows B and C are similar to flow A. In flows B and C, another step 540 is performed, in which a commercial solvent rinsing process is performed to the wafer. In some embodiments, the commercial solvent may include other commonly used solvents in the industry in a photolithography process. The difference between flows B and C is that, the step 540 (commercial solvent rinsing) is performed after the step 530 in flow B, but it is performed before the step 530 in flow C.

Regardless of the specific flow, it is understood that the optional step 510 of rinsing the wafer with the high-contact-angle material will facilitate the cleaning process discussed above. In some embodiments, the high-contact-angle material includes a carbon fluoride compound, for example a $C_xF_y$ unit. In various embodiments, x is in a range between 1 and 7, and y is saturated by structure. This carbon fluoride compound may be in the form of an additive that is added to a solvent. In some embodiments, the carbon fluoride compound is a polymer. The carbon fluoride compound may be branched in some embodiments, but unbranched in other embodiments. The carbon fluoride compound may also be cyclic in some embodiments, but uncyclic in other embodiments. In some embodiments, the carbon fluoride compound may be saturated with hydrogen or halogen atom.

In embodiments where the carbon fluoride compound is a polymer, the polymer chain may include polystyrene, acrylate, or a 1~10 carbon unit to form a polymer. The polymer may be within a $C_xF_y$ monomer.

FIG. 11 is a flowchart of a method 600 of performing a semiconductor fabrication process according to various aspects of the present disclosure.

The method 600 includes a step 610 of forming a patternable layer over a substrate. In some embodiments, the substrate is substantially conductive or semi-conductive. The electrical resistance may be less than about $10^3$ ohm-meter. In some embodiments, the substrate contains metal, metal alloy, or metal nitride/sulfide/selenide/oxide/silicide with the formula MXa, where M is a metal, and X is N, S, Se, O, Si, and where "a" is in a range from about 0.4 to 2.5. For example, the substrate 48 may contain Ti, Al, Co, Ru, TiN, $WN_2$, or TaN. In some other embodiments, the substrate contains a dielectric material with a dielectric constant in a range from about 1 to about 40. In some other embodiments, the substrate contains Si, metal oxide, or metal nitride, where the formula is MXb, wherein M is a metal or Si, and X is N or O, and wherein "b" is in a range from about 0.4 to 2.5. For example, the substrate may contain $SiO_2$, silicon nitride, aluminum oxide, hafnium oxide, or lanthanum oxide.

The patternable layer formed over the substrate has different optical properties than photoresist. For example, the patternable layer has a different n, k, or T value from photoresist. In some embodiments, the layer comprises at least one of different polymer structure, acid labile molecule, PAG (photo acid generator) loading, quencher loading, chromophore, cross linker, or solvent, which lead to different n value to photoresist. In some embodiments, the patternable layer and photoresist have different etching resistance. In some embodiments, the patternable layer contains an etching resistant molecule. The molecule includes low onishi number structure, double bond, triple bond, silicon, silicon nitride, Ti, TiN, Al, aluminum oxide, SiON, or combinations thereof.

The method 600 includes a step 620 of coating a photoresist layer over the patternable layer. The photoresist layer includes a metal-containing material.

The method 600 includes a step 630 of performing a lithography process to the photoresist layer to form a patterned photoresist. In some embodiments, the lithography process includes an extreme ultraviolet (EUV) lithography process.

The method 600 includes a step 640 of cleaning the wafer with a cleaning fluid to remove the metal-containing material. In some embodiments, the cleaning fluid includes a solvent having Hansen solubility parameters of delta. D in a range between 13 and 25, delta P in a range between 3 and 25, and delta H in a range between 4 and 30. In some embodiments, the solvent is an aqueous solvent. In some embodiments, the solvent is an organic solvent. In some embodiments, the solvent contains an acid with an acid dissociation constant (pka) less than 4, for example between −11 and 4. In some embodiments, the solvent contains a base with an acid dissociation constant (pka) greater than 9, for example between 9 and 40. In some embodiments, the solvent contains a metal chelate. In some embodiments, the solvent contains a surfactant. In some embodiments, the solvent is heated to a temperature ranging between room temperature and 75 degrees Celsius. In some embodiments, the cleaning the wafer comprises spinning the wafer as the wafer is being cleaned.

In some embodiments, the cleaning the wafer comprises applying the cleaning fluid to at least one of: a back side of the wafer or a side edge of the wafer. In some embodiments, the cleaning the wafer comprises delivering a purging fluid to the wafer, the purging fluid being delivered to at least one of: a back side of the wafer or a side edge of the wafer. In some embodiments, the performing the lithography process includes performing: a photoresist-coating process, a pre-exposure baking process, an exposure process, a post-exposure baking process, and a developing process. The cleaning the wafer may be performed while the photoresist-coating process or the developing process is performed. The cleaning the wafer may also be performed: after the photoresist-coating process, after the pre-exposure baking process, after the post-exposure baking process, or after the developing process.

It is understood that additional processes may be performed before, during, or after the steps 610-640 of the method 600 to complete the fabrication of the semiconductor device. For reasons of simplicity, these additional steps are not discussed herein in detail.

Based on the above discussions, it can be seen that the present disclosure offers advantages over conventional methods. It is understood, however, that other embodiments may offer additional advantages, and not all advantages are necessarily disclosed herein, and that no particular advantage is required for all embodiments. One advantage is that the photoresist material herein offers improved lithography performance, for example better photon absorption performance due to the presence of metal or metal compounds in the photoresist. Another advantage is that the systems and methods of cleaning the wafer using the novel solvent herein as a cleaning fluid to wash the metal-containing material off the wafer) reduce contamination caused by the metal-containing material, for both the apparatus in which the lithography process is performed, and also for other semiconductor fabrication tools to which the wafer (after being cleaned) is transferred. For at least these reasons, the present disclosure improves semiconductor fabrication performance.

One aspect of the present disclosure pertains to a method of fabricating a semiconductor device. A photoresist layer is coated over a wafer. The photoresist layer includes a metal-containing material. A lithography process is performed to the photoresist layer to form a patterned photoresist. The wafer is cleaned with a cleaning fluid to remove the metal-containing material.

Another aspect of the present disclosure pertains to a method of fabricating a semiconductor device. A photoresist layer is coated over a wafer. The photoresist layer includes a metal-containing material. An extreme ultraviolet (EUV) lithography process is performed to the photoresist layer to form a patterned photoresist. The wafer is cleaned with a cleaning fluid to remove the metal-containing material. The cleaning fluid includes a solvent having Hansen solubility parameters of delta D in a range between 13 and 25, delta P in a range between 3 and 25, and delta H in a range between 4 and 30. The solvent contains an acid with an acid dissociation constant less than 4 or a base with an acid dissociation constant greater than 9.

Yet another aspect of the present disclosure pertains to a system of fabricating a semiconductor device. The system includes a chamber configured to coat a metal-containing photoresist material onto a wafer as a part of an EUV lithography process. The system includes one or more first nozzles configured to apply a cleaning fluid to the wafer. The cleaning fluid has a material composition configured for removing a metal contaminant from the wafer. The metal contaminant arises from the metal-containing photoresist material. The system includes one or more second nozzles configured to apply a purging fluid to the wafer. The purging fluid facilitates a removal of the metal contaminant from the wafer.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of fabricating a semiconductor device, comprising:
   coating a photoresist layer over a wafer, wherein a first portion of the photoresist layer includes a metal-containing material;
   after the coating of the photoresist layer over the wafer, cleaning the wafer with a cleaning fluid to remove the metal-containing material from the first portion of the photoresist layer;
   during the cleaning of the wafer with the cleaning fluid, delivering a purging gas to the first portion of the photoresist layer, wherein the cleaning fluid and the purging gas are different from each other; and
   after the cleaning of the wafer, performing a lithography exposure process to the photoresist layer of the cleaned wafer, wherein the lithography exposure process includes performing an extreme ultraviolet (EUV) lithography exposure process.

2. The method of claim 1, wherein the cleaning fluid includes a solvent having Hansen solubility parameters of delta D in a range between 13 and 25, delta P in a range between 3 and 25, and delta H in a range between 4 and 30.

3. The method of claim 2, wherein the solvent is an aqueous solvent.

4. The method of claim 2, wherein the solvent is an organic solvent.

5. The method of claim 2, wherein the solvent contains an acid with an acid dissociation constant (pka) between −11 and 4, and wherein the solvent contains a base with an acid dissociation constant (pka) between 9 and 40.

6. The method of claim 2, wherein the solvent contains a metal chelate.

7. The method of claim 2, wherein the solvent contains a surfactant.

8. The method of claim 1, further comprising: before the coating of the photoresist layer, applying a solvent including a high-contact-angle material to the wafer, wherein the applying of the solvent makes a surface of the wafer hydrophobic.

9. The method of claim 8, wherein the high-contact-angle material includes carbon fluoride.

10. The method of claim 1, wherein the cleaning the wafer comprises spinning the wafer as the wafer is being cleaned.

11. The method of claim 1, wherein the cleaning the wafer comprises applying the cleaning fluid to at least one of: a back side of the wafer or a side edge of the wafer.

12. The method of claim 1, wherein the purging gas is delivered to at least one of: a back side of the wafer or a side edge of the wafer.

13. The method of claim 1, further comprising:
    performing a pre-exposure baking process, a post-exposure baking process, and a developing process to form a patterned photoresist, wherein the cleaning the wafer is performed after the pre-exposure baking process.

14. A method of fabricating a semiconductor device, comprising:
    coating a photoresist layer over a wafer, wherein the photoresist layer includes a metal-containing material;
    before the coating of the photoresist layer, applying a high-contact-angle material to the wafer, wherein the applying of the high-contact-angle material makes a surface of the wafer hydrophobic;
    performing an extreme ultraviolet (EUV) lithography exposure process; and
    after the coating of the photoresist layer, cleaning the wafer with a cleaning fluid to remove the metal-containing material prior to performing the EUV lithography exposure process to the photoresist layer of the cleaned wafer;
    wherein:
    the cleaning fluid includes a solvent having Hansen solubility parameters of delta D in a range between 13 and 25, delta P in a range between 3 and 25, and delta H in a range between 4 and 30; and
    the solvent contains an acid with an acid dissociation constant less than 4 or a base with an acid dissociation constant greater than 9.

15. The method of claim 14, wherein the cleaning of the wafer with the cleaning fluid to remove the metal-containing material comprises applying the cleaning fluid to at least one of: a back side of the wafer or a side edge of the wafer.

16. The method of claim 14, wherein the solvent contains a metal chelate.

17. A method comprising:
    receiving a wafer;
    forming a photoresist material on a surface of the wafer, wherein the photoresist material includes a metal component;
    performing a photolithographic exposure of the photoresist material; and
    performing a cleaning process on the wafer to remove a portion of the metal component, wherein the cleaning process includes applying a cleaning solution that includes a polar solvent to a portion of the wafer selected from the group consisting of: a back side portion of the wafer and a side edge portion of the wafer, wherein the cleaning process occurs during the forming of the photoresist material on the surface of the wafer.

18. The method of claim 17, wherein the cleaning solution further includes an ingredient from a group consisting of: an organic acid, an organic base, and a metal chelate.

19. The method of claim 17, wherein the cleaning process further includes applying a purge gas to the selected portion of the wafer during the applying of the cleaning solution to the selected portion of the wafer.

20. The method of claim 19, wherein the cleaning process further includes applying negative atmospheric pressure to exhaust air surrounding the wafer.

\* \* \* \* \*